(12) United States Patent
Kashiwabara et al.

(10) Patent No.: US 8,072,135 B2
(45) Date of Patent: Dec. 6, 2011

(54) ORGANIC EL DEVICE AND DISPLAY (75) Inventors: Mitsuhiro Kashiwabara, Kanagawa (JP); Ryoko Matsuura, Tokyo (JP)

(73) Assignee: Sony Corporation, Tokyo (JP)

( * ) Notice: Subject to any disclaimer, the term of this patent is extended or adjusted under 35 U.S.C. 154(b) by 1219 days.

(21) Appl. No.: 10/568,525

(22) PCT Filed: Aug. 11, 2004

(86) PCT No.: PCT/JP2004/011807
§ 371 (c)(1),
(2), (4) Date: Feb. 15, 2006

(87) PCT Pub. No.: WO2005/027585
PCT Pub. Date: Mar. 24, 2005

(65) Prior Publication Data
US 2006/0238113 A1    Oct. 26, 2006

(30) Foreign Application Priority Data

Aug. 22, 2003  (JP) ................ P2003-298268

(51) Int. Cl.
*H01L 51/50* (2006.01)
*H05B 33/14* (2006.01)
(52) U.S. Cl. ........ 313/504; 313/500; 313/503; 313/505; 313/506
(58) Field of Classification Search .......... 313/498–512; 315/169.3, 169.4; 257/40, 79; 428/690; 345/44, 46
See application file for complete search history.

(56) References Cited

U.S. PATENT DOCUMENTS 5,151,529 A    9/1992  Sato et al.
6,198,217 B1*  3/2001  Suzuki et al. ............ 313/504
(Continued)

FOREIGN PATENT DOCUMENTS
EP    1414081 A2    4/2004
(Continued)

OTHER PUBLICATIONS

Forrest et al., "White-light-emitting organic electroluminescent devices based on interlayer sequential energy transfer", Applied Physics Letters, vol. 75, No. 7, Aug. 16, 1999.*

(Continued)

*Primary Examiner* — Karabi Guharay
*Assistant Examiner* — Elmito Breval
(74) *Attorney, Agent, or Firm* — K&L Gates LLP (57) ABSTRACT

An organic EL device and display are provided. An organic EL device which has light emission components in three colors of red, green and blue in a good balance suited to use for a full-color display and which is capable of highly efficient and stable light emission for a long time. In the organic EL device including an organic layer having light emitting layers sandwiched between an anode and a cathode, the light emitting layers include a red light emitting layer, a green light emitting layer, and a blue light emitting layer laminated in this order from the side of the anode. The red light emitting layer contains a hole transporting light emitting material and has a hole transporting property. In addition, the green light emitting layer has a positive and negative charge transporting property. Furthermore, the blue light emitting layer has an electron transporting property, and includes a positive and negative charge transporting blue light emitting layer and an electron transporting blue light emitting layer laminated in this order from the side of the anode.

13 Claims, 4 Drawing Sheets

U.S. PATENT DOCUMENTS

| | | | |
|---|---|---|---|
| 6,365,270 B2 * | 4/2002 | Forrest et al. | 428/336 |
| 6,831,406 B1 * | 12/2004 | Fukuyama et al. | 313/504 |
| 2001/0019245 A1 * | 9/2001 | Ohshita et al. | 313/506 |
| 2001/0031509 A1 * | 10/2001 | Yamazaki | 438/48 |
| 2001/0043043 A1 | 11/2001 | Aoyama et al. | |
| 2004/0048100 A1 * | 3/2004 | Ebisawa et al. | 428/690 |
| 2004/0185300 A1 * | 9/2004 | Hatwar et al. | 428/690 |
| 2005/0233166 A1 * | 10/2005 | Ricks et al. | 428/690 |

FOREIGN PATENT DOCUMENTS

| | | |
|---|---|---|
| JP | 08-078163 | 3/1996 |
| JP | 10-003990 | 1/1998 |
| JP | 10003990 A * | 1/1998 |
| JP | 2000-058264 | 2/2000 |
| JP | 2000-58264 | 2/2000 |
| JP | 2001-106658 | 4/2001 |
| JP | 2001-110570 | 4/2001 |
| JP | 2002-226722 | 8/2002 |
| JP | 2002-313583 | 10/2002 |

OTHER PUBLICATIONS

Office Action issued by the Japanese Patent Office on May 15, 2007 for corresponding Japanese Patent Application No. 2003-298268.
Supplementary European Search Report dated Aug. 25, 2010 corresponding to European Patent Appln. No. 04771768.

* cited by examiner

ORGANIC EL DEVICE AND DISPLAY

CROSS REFERENCE TO RELATED APPLICATIONS

The present application claims priority to Japanese Patent Document No. P2003-298268 filed on Aug. 22, 2003 the disclosure of which is herein incorporated by reference.

The present invention relates to an organic EL device in which an organic layer including a plurality of light emitting layers is interposed between an anode and a cathode, and a display using the organic EL device.

In recent years, as a display to be used in place of a cathode ray tube (CRT), flat displays light in weight and low in power consumption have been an object of vigorous research and development. Among the flat displays, those displays which use self-light-emitting type display devices (so-called light emitting devices) such as organic EL (Electroluminescence) devices and organic EL devices have been paid attention to as a display capable of being driven with low power consumption.

Configurations for achieving a full-color display mode with the display using the light emitting devices as above-mentioned include one in which an organic EL device capable of emitting white light is combined with color filters which respectively transmit only light in the blue, green or red wavelength region. In addition, as the organic EL device for emitting white light, one having a configuration in which a blue light emitting layer, a green light emitting layer, and a red light emitting layer are laminated in this order from the hole transport layer side and which has three wavelength light emission components has been disclosed (see Japanese Patent Laid-open No. Hei 10-3990 (see, particularly, FIG. 1)).

However, the white light emitting organic EL device with the above-mentioned configuration has the problem that the emission spectrum is largely varied with current and that the luminous efficacy and the half life of luminance are insufficient for display use. In addition, the organic EL device is insufficient in balance of respective luminous intensities in blue, green and red wavelength regions. Therefore, it has been impossible by use of such organic EL devices to obtain a display comparable in color reproduction performance with a CRT.

SUMMARY

Accordingly, it is an object of the present invention to provide an organic EL device having light emission components of three colors of red, green and blue in a good balance suited to use for a full-color display, having a high efficiency and being capable of stable light emission for a long time, and a display excellent in color reproduction performance and capable of being driven for a long time.

According to an embodiment of the present invention, there is provided an organic EL device characterized by the configuration of an organic layer sandwiched between an anode and a cathode. Specifically, light emitting layers constituting the organic layer include a red light emitting layer, a green light emitting layer, and a blue light emitting layer laminated in this order from the anode side.

In the organic EL device configured as above, holes (positive holes) injected from the anode is supplied into the light emitting layers from the red light emitting layer side. On the other hand, electrons injected from the cathode are supplied into the light emitting layers from the blue light emitting layer side. Therefore, the regions where the holes injected from the anode and the electrons injected from the cathode are coupled, i.e., light emission regions are respectively in the red, green, and blue light emitting layers, and each of the light-emitting layers emits light with the corresponding wavelength. Particularly, the lamination of the red light emitting layer, the green light emitting layer, and the blue light emitting layer in this order from the anode side permits a configuration such that the injection of holes and electrons as well as the light emission regions can be controlled and that the emission efficacy is higher and the half life of luminance is longer, as compared with the case where a blue light emitting layer, the green light emitting layer, and a red light emitting layer are laminated in this order from the hole transport layer side.

In the organic EL device as above, preferably, the red light emitting layer has a hole transporting property. This ensures that some of the holes injected from the anode side contribute to red light emission in the red light emitting layer, whereas the rest of the holes are supplied further into the green light emitting layer and the blue light emitting layer, which are disposed on the anode side of the red light emitting layer, to contribute to light emission.

The hole transporting material included in the red light emitting layer as above may generally be a hole transporting material for constituting a hole transport layer provided between the anode and the light emitting-layers, and is preferably a red light emitting material having a hole transporting property (hole transporting red light emitting material). This enables a highly efficient and stable light emission with a high color purity. As the hole transporting red light emitting material, for example, a styrylarylene based material can be utilized. Particularly, the styrylarylene based materials described in Japanese Patent Laid-open Nos. 2001-110570 and 2002-226722 are preferably used. These materials are high in efficiency, have a long half life of luminance, and can be doped in a high density. Furthermore, since these materials have a hole transporting property, they make it possible to provide the red light emitting layer with an appropriate hole transporting property even where the host material of the red light emitting layer is an electron transporting material. Moreover, since the styrylarylene based material mentioned above can be doped with a dopant in a high concentration, the material can have a highest hole transporting property, so that where this material is used on the most anode side, holes can be securely supplied to the green light emitting layer provided on the cathode side.

Besides, in the organic-EL device as above, preferably, the green light emitting layer has a positive and negative charge transporting property for transporting both holes and electrons. This ensures that some of the holes injected through the red light emitting layer contribute to light emission in the green light emitting layer, and the rest of the holes are transported further into the blue light emitting layer disposed on the cathode side. Simultaneously, when electrons are injected through the blue light emitting layer on the cathode side, some of the electrons contribute to light emission in the green light emitting layer, and the rest of the electrons are transported into the red light emitting layer. With the green light emitting layer thus having the positive and negative charge transporting property, it is possible to obtain sufficient emission of light from each of the red, green and blue light emitting layers.

As a method for providing the green light emitting layer with the positive and negative charge transporting property, there may be contemplated the methods of (1) doping a positive and negative charge transporting host with a green light emitting material, (2) doping a hole transporting host with an electron transporting green light emitting material (3) doping an electron transporting host with a hole transporting green light emitting material, (4) doping a mixed host composed of a hole transporting material and an electron transporting material with a green light emitting material, and so on. In this instance, the hole transporting material in the green light emitting layer may be a hole transporting material used for forming the hole transport layer. Besides, the electron transporting material in the green light emitting layer may be an electron transporting host material used in the blue light emitting layer. Examples of the green light emitting material include cumarin based or quinacridone based materials, and arylamine based materials, but the green light emitting material is not limited to these examples.

In the organic EL device as above, preferably, the blue light emitting layer has an electron transporting property. This ensures that some of the electrons injected from the cathode side contribute to blue light emission in the blue light emitting layer, and the rest of the electrons are transported into the green light emitting layer and further into the red light emitting layer, which are disposed on the anode side, to contribute to green light emission and red light emission.

Particularly, the blue light emitting layer may have a configuration in which a positive and negative charge transporting blue light emitting layer and an electron transporting blue light emitting layer are laminated in this order from the anode side (from the green light emitting layer side). This ensures that the holes supplied via the green light emitting layer can be efficiently carried into a wide region in the blue light emitting layer, to permit highly efficient and stable light emission with high color purity.

As a method for providing the blue light emitting layer with the positive and negative charge transporting property, there may be contemplated the methods of (1) doping a positive and negative charge transporting host with a blue light emitting material, (2) doping a hole transporting host with an electron transporting blue light emitting material, (3) doping an electron transporting host with a hole transporting blue light emitting material, (4) doping a mixed host composed of a hole transporting material and an electron transporting material with a blue light emitting material, and so on.

In the organic EL device configured as above, preferably, the red light emitting layer has a hole transporting property, the green light emitting layer has a positive and negative charge transporting property, and the blue light emitting layer has an electron transporting property, whereby it is possible to obtain light emission having red, green and blue light emission components. Besides, as for the intensity ratios between the light emission colors, the balance between the hole transporting property and the electron transporting property for each of red, green and blue colors can be controlled by regulating the film thickness, the mixing ratio of materials, or the like.

In addition, according to the present invention, there is provided a display characterized in that a color filter is provided on the light take-out surface side of the above-described organic EL device.

According to such a display, by combining a plurality of the organic EL devices excellent in balance between the light emission colors with respective color filters, rays in the blue, green and red wavelength regions can be taken out in a good balance.

As has been described above, according to the organic EL device of the present invention, rays in the wavelength regions of three colors of red, green and blue can be stably emitted with a good balance and at a high efficiency for a long time. Therefore, by combining the organic EL devices with color filters, it is possible to configure a display excellent in color reproduction performance and capable of being driven for a long time.

Additional features and advantages of the present invention are described in, and will be apparent from, the following Detailed Description and the Figures.

DETAILED DESCRIPTION

Figure 1:
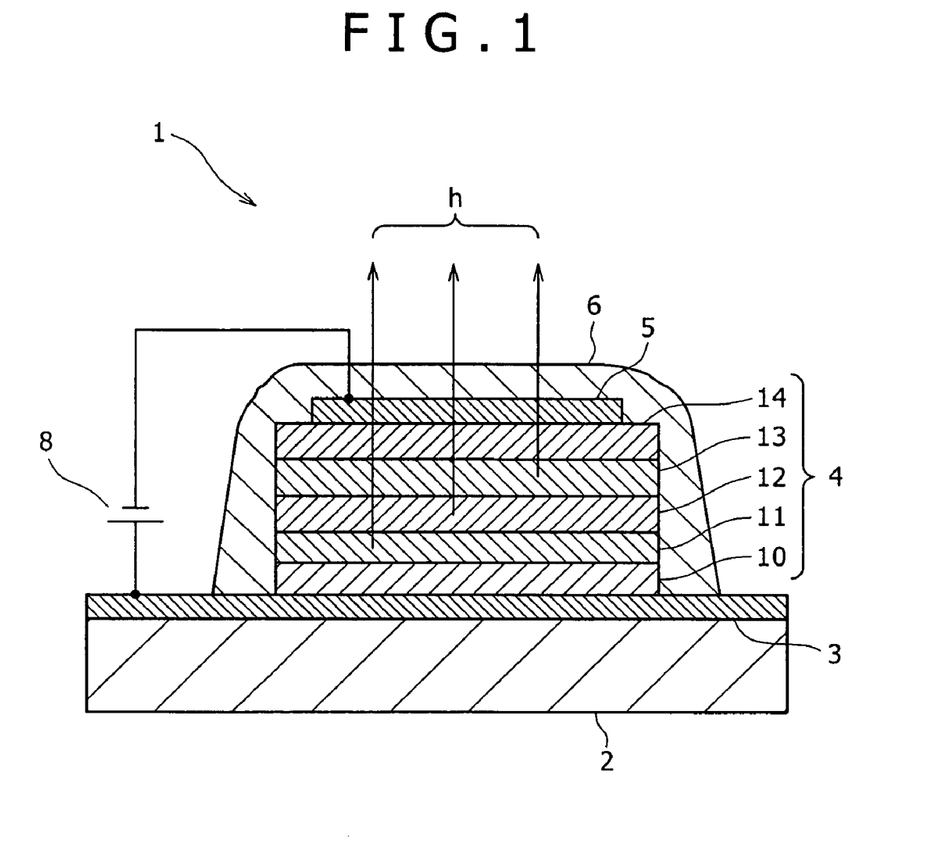
FIG. 1 is a sectional diagram showing a configuration of an organic EL device according to an embodiment of the present invention.
Figure 2:
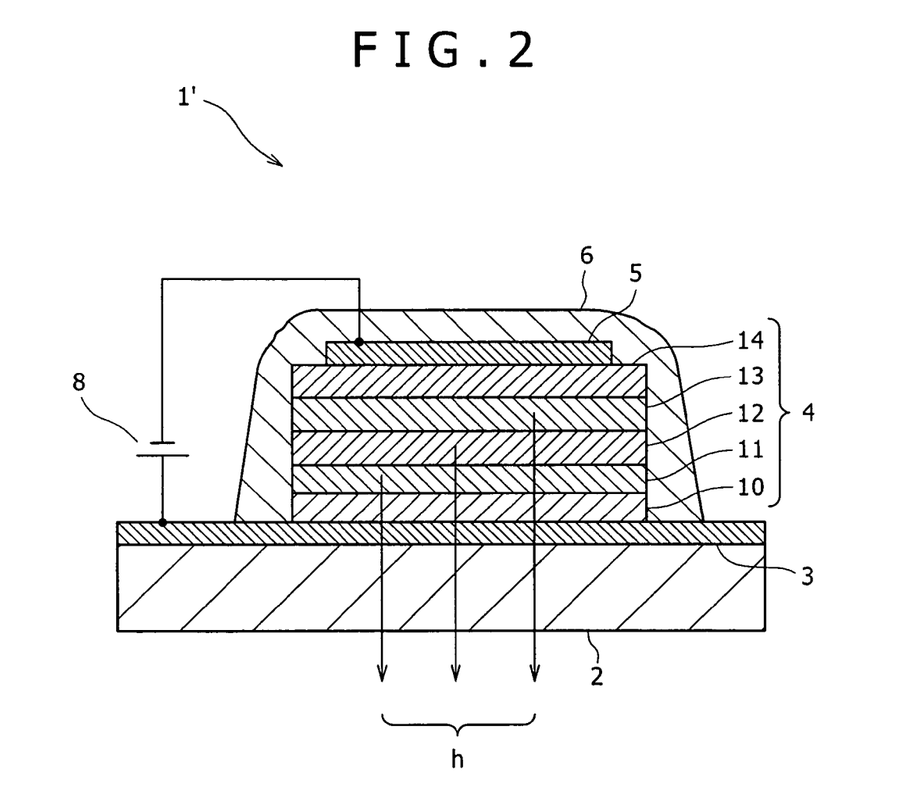
FIG. 2 is a sectional diagram showing another configuration of the organic EL device according to an embodiment of the present invention.

Now, the configuration of an organic EL device according to the present invention will be described in detail below based on the drawings. FIGS. 1 and 2 are sectional diagrams schematically showing the organic EL devices of the present invention.

Each of the organic EL devices 1 and 1' shown in these drawings is provided, for example, in each pixel of a substrate 2 constituting a display, includes an anode 3, an organic layer 4 and a cathode 5 laminated in this order from the side of the substrate 2, and is covered gas-tight with a protective film 6. Particularly, the organic EL device 1 shown in FIG. 1 is configured to be of the so-called top emission type, in which the light h emitted by the organic EL device 1 is taken out on the side opposite to the substrate 2. On the other hand, the organic EL device 1' shown in FIG. 2 is configured to be of the so-called bottom emission type, in which the light h emitted by the organic EL device 1' is taken out on the side of the substrate 2.

Next, detailed configurations of the component parts of each of the organic EL devices 1 and 1' will be described in the order of the substrate 2, the anode 3, the cathode 5 paired with the anode 3, and the organic layer 4 sandwiched between the anode 3 and the cathode 5.

<Substrate>

First, the substrate 2 is composed of a glass substrate, a silicon substrate, a plastic substrate, or a TFT (thin film transistor) substrate provided with a TFT, or the like; particularly, in the case of the bottom emission type organic EL device shown in FIG. 2, the substrate 2 is composed 7 of a light transmitting material. In addition, where the organic EL device 1, 1' is used in combination with other display device, the substrate may be used in common for both the devices.

<Anode>

The anode 3 provided on the substrate 2 is composed of a conductive material having a great work function. Examples of the conductive material having a great work function include nickel, silver, gold, platinum, palladium, selenium, rhodium, ruthenium, iridium, rhenium, tungsten, molybdenum, chromium, tantalum, niobium, alloys of these metals, tin oxide ($SnO_2$), indium tin oxide (ITO), zinc oxide, and titanium oxide.

<Cathode>

On the other hand, the cathode 5 connected to the anode 3 through a power supply 8 is composed of a conductive material having a small work function. Examples of the conductive material having a small work function include alloys of an active metal such as Li, Mg, Ca, etc. with such a metal as Ag, Al, In, etc., and laminates of these alloys. In addition, a structure may be adopted in which a layer of a compound of an active metal such as Li, Mg, Ca, etc. with a halogen such as fluorine, bromine, etc. or oxygen or the like is inserted in a thin form between the cathode 5 and the organic layer 4.

Of the anode 3 and the cathode 5 as above, the one electrode disposed on the side of taking up the emitted light h generated in the organic layer 4 is composed by appropriately selecting and using a light transmitting one of the above-mentioned materials, and the thickness thereof is so regulated as to obtain a light transmittance suited to the use. On the other hand, the other electrode is composed by appropriately selecting and using a material having a good reflectance.

In addition, the anode 3 and the cathode 5 are patterned into a suitable shape depending on the drive system of the display to be constituted by use of the organic EL devices 1 or 1'. For example, in the case where the drive system of the display is the simple matrix type, the anode 3 and the cathode 5 are formed in the form of stripes intersecting each other, and the intersection portions constitute the organic EL devices 1, 1'. In the case where the drive system of the display is the active matrix type having a TFT for each pixel, the anode 3 is patterned according to each of a plurality of pixels arranged, in the state of being connected to the TFT similarly provided for each pixel through a contact hole (not shown) formed in a layer insulation film covering the TFTs. On the other hand, the cathode 5 may be formed in the form of a solid film formed to cover the entire surface of the substrate 2, to be used as a common electrode for the pixels. It should be noted here that in the case of adopting the active matrix type as the drive system of the display, it is preferable to use the top emission type organic EL device 1 shown in FIG. 1, since it is thereby possible to enhance the numerical aperture of the device.

<Organic Layer>

The organic layer 4 sandwiched between the anode 3 and the cathode 5 includes a hole transport layer 10, a red light emitting layer 11, a green light emitting layer 12, a blue light emitting layer 13, and an electron transport layer 14 laminated in this order from the side of the anode 3. Now, the configurations of these layers 10-14 will be described below, sequentially from the side of the anode 3.

<Hole Transport Layer>

First, the hole transport layer 10 provided on the anode 3 is a layer designed to transport the holes (positive holes). The hole transport layer 10 may be composed by laminating a plurality of hole transporting materials, for enhancing the hole transport performance.

Examples of the material (hole transporting material) for forming the hole transport layer 10 include heterocyclic conjugated monomers, oligomers and polymers, including not only benzidine and derivatives thereof, styrylamine and derivatives thereof, and triphenylmethane and derivatives thereof but also porphyrin and derivatives thereof, triazole and derivatives thereof, imidazole and derivatives thereof, oxadiazole and derivatives thereof, polyarylalkanes and derivatives thereof, phenylenediamine and derivatives thereof, arylamines and derivatives thereof, oxazole and derivatives thereof, anthracene and derivatives thereof, fluorenone and derivatives thereof, hydrazine and derivatives thereof, stilbene and derivatives thereof, phthanocyanine and derivatives thereof, polysilane based compounds, vinylcarbazole based compounds, thiophene based compounds, aniline based compounds, etc.

Specific, but not limitative, examples of the hole transport materials include α-naphthylphenyldiamine (α-NPD), porphyrin, metallotetraphenylporphrin, metallonaphthalocyanine, 4,4',4"-trimethyltriphenylamine, 4,4',4"-tris(3-methylphenylphenylamino)triphenylamine (m-MTDATA), N,N,N',N'-tetrakis(p-tolyl)p-phenylenediamine, N,N,N',N'-tetraphenyl-4,4'-diaminobiphenyl, N-phenylcarbazole, 4-di-p-tolylaminostylbene, poly(paraphenylenevinylene), poly(thiophenevinylene), poly(2,2'-thienylpyrrole), etc.

<Red Light Emitting Layer>

In the next place, the red light emitting layer 11 provided on the hole transport layer 10 is preferably so designed that some of the holes injected through the hole transport layer 10 are re-coupled in the red light emitting layer 11 to give red light emission, and the rest of the holes not contributing to the light emission in the red light emitting layer are transported into the green light emitting layer 12, for contributing to green light emission and blue light emission.

Such a red light emitting layer 11 is configured by combining the required materials appropriately selected from (a) a red light emitting material (fluorescent or phosphorescent), (b) a hole transporting material, (c) an electron transporting material and (d) a positive and negative charge transporting material. Each of these materials is used together with a single or a plurality of materials appropriately selected from among the following material categories, as required, for securing light emission performance and hole transport performance.

The material categories include cyclopentadiene derivatives, tetraphenylbutadiene derivatives, triphenylamine derivatives, oxadiazole derivatives, bathophenanthroline derivatives, pyrazoloquinoline derivatives, styrylbenzene derivatives, styrylarylene derivatives, aminostyryl derivatives, silole derivatives, thiophene ring derivatives, pyridine ring compounds, perinone derivatives, perylene derivatives, oligothiophene derivatives, cumarin derivatives, rubrene derivatives, quinacridone derivatives, squalium derivatives, porphyrin derivatives, styryl based coloring matter, tetracene derivatives, pyrazoline derivatives, trifumanylamine derivatives, anthracene derivatives, diphenylanthracene derivatives, pyrene derivatives, carbazole derivatives, oxadiazole dimer, pyrazoline dimer, aluminum-quinolinol complex, benzoquinolinol-beryllium complex, benzoxazole-zinc complex, benzothiazole-zinc complex, azomethyl-zinc complex, porphyrin-zinc complex, europium complexes, iridium complexes, platinum complexes, etc. and metal complexes having such a metal as Al, Zn, Be, Pt, Ir, Tb, Eu, Dy, etc. as a center metal and having an oxadiazole, thiadiazole, phenylpyridine, phenylbenzoimidazole or quinoline structure or the like as a ligand.

Particularly, specific examples of (a) red light emitting material include bis(aminostyryl)naphthalene (BSN) represented by the following formula (1), which is a styrylarylene derivative. Such a styrylarylene based material, examples of which are described in Japanese Patent Laid-open No. 2001-106658, can be used to dope a host material therewith in a high concentration, and has a hole transporting property due to its triphenylamine skeleton. Therefore, when such a red light emitting material is used, efficient red light emission and a high hole transporting property can be obtained, which is the reason why it is preferable to form the red light emitting layer 11 in contact with the hole transport layer 10.

Formula (1):

BSN

Specific, but not limitative, examples of (b) hole transporting material include α-NPD, and specific, but not limitative, examples of (c) electron transporting material include 4,4'-bis(2,2-dphenyl-ethen-1-yl)-diphenyl (DPVBi) represented by the following formula (2), which is a styrylarylene derivative.

Formula (2):

DPVBi

<Green Light Emitting Layer>

The green light emitting layer 12 provided on the red light emitting layer 11 preferably has a positive and negative charge transporting property for transporting both holes and electrons. This characteristic property ensures that some of the holes injected through the red light emitting layer 11 contribute to light emission in the green light emitting layer 12, whereas the rest of the holes are transported into the blue-light emitting layer 13, and that some of the electrons injected from the side of the blue light emitting layer 13 contribute to light emission in the green light emitting layer 12, whereas the rest of the electrons are transported into the red light emitting layer 11. This makes it possible to achieve respective light emissions from the red, green and blue light emitting layers 11, 12, 13.

As a method for providing the green light emitting layer 12 with the positive and negative charge transporting property, there may be contemplated the methods of (1) doping a positive and negative charge transporting host with a green light emitting material, (2) doping a hole transporting host with an electron transporting green light emitting material, (3) doping an electron transporting host with a hole transporting green light emitting material, (4) doping a mixed host composed of a hole transporting material and an electron transporting material with a green light emitting material, and so on. In this instance, the hole transporting material in the green light emitting layer 12 may be the hole transporting material used to form the hole transport layer. In addition, the electron transporting material in the green light emitting layer 12 may be the electron transporting host material constituting the blue light emitting layer 13 which will be described below.

As the material(s) for constituting the green light emitting layer 12, a single material or a plurality of materials are appropriately selected from among the above-mentioned material categories.

Furthermore, in the organic EL device 1 according to the present invention in which the red light emitting layer 11 is present on the side of the hole transport layer 10, the green light emitting layer 12 is preferably provided between the red light emitting layer 11 and the blue light emitting layer 13. This is because of the problems that (1) in the case where the red light emitting layer 11 and the blue light emitting layer 13 are adjacent to each other, the energy of the excitons generated in the blue light emitting layer 13 would easily move into the red light emitting layer 11. As a result, a sufficient blue light intensity would not easily be obtained, and that (2) in the case where the blue light emitting layer 13 is provided between the red light emitting layer 11 and the green light emitting layer 12, the energy of the excitons would be deprived by both the red light emitting layer 11 and the green light emitting layer 12, and the like problems. Besides, in the case of the configuration in which, for example, an electron transporting host is doped with a hole transporting green light emitting material, each of the layers constituting the organic layer 4 can be formed by binary co-deposition, which promises a function as a white device and eliminates the need for such a complicated manufacturing process as that for ternary co-deposition.

<Blue Light Emitting Layer>

In the next place, the blue light emitting layer 13 provided on the green light emitting layer 12 has an electron transporting property. This ensures that some of the electrons injected through the electron transport layer 14 into the blue light emitting layer 13 contribute to blue light emission in the blue light emitting layer 13, whereas the rest of the electrons are transported into the green light emitting layer 12 and the red light emitting layer 11 to contribute to green light emission and red light emission.

The blue light emitting layer 13 is configured by combining the required materials appropriately selected from among (a) a blue light emitting material (fluorescent or phosphorescent), (b) a hole transporting material, (c) an electron transporting material, and (d) a positive and negative charge transporting material. As each of these materials, a single material or a plurality of materials are appropriately selected from among the above-mentioned material categories, as required, so as to secure light emission performance and hole transport performance.

Particularly, specific examples of (a) blue light emitting material include perylene, specific examples of (b) hole transporting material include α-NPD, and specific examples of (c) include DPVBi of the above formula (2), which is a styrylarylene derivative, the examples being not limitative.

In addition, the blue light emitting layer 13 may have a positive and negative charge transporting blue light emitting layer and an electron transporting blue light emitting layer laminated in this order from the side of the green light emitting layer 12. With the blue light emitting layer 13 having such a laminate structure, holes can be efficiently transported to the whole region inside the blue light emitting layer 13, which enables a highly efficient and stable light emission with a high color purity. As a method for providing the blue light emitting layer 13 with the positive and negative charge transporting property, there may be contemplated the methods of (1) doping a positive and negative charge transporting host with a blue light emitting material, (2) doping a hole transporting host with an electron transporting blue light emitting material, (3) doping an electron transporting host with a hole transporting blue light emitting material, (4) doping a mixed host composed of a hole transporting material and an electron transporting material with a blue light emitting material, and so on.

The blue light emitting layer 13 according to the present invention is so configured that the energy of excitons generated through re-coupling of positive and negative charges in the blue light emitting layer 13 is made to contribute to the light emission in the blue light emitting layer 13 while minimizing the movement of the energy into the red light emitting layer 11 and the green light emitting layer 12. Therefore, it is preferable for the blue light emitting layer 13 to be provided on the most cathode 5 side.

<Electron Transport Layer>

In addition, the electron transport layer 14 provided between the blue light emitting layer 13 and the cathode 5 is a layer so designed as to transport electrons. The electron transport layer 14 may be configured by laminating a plurality of electron transport materials, for enhancing the electron transport performance.

Non-limitative examples of the electron transporting material as above include 8-hydroxyquinoline aluminum (Alq3), 8-hydroxymethylquinoline aluminum, anthracene, naphthalene, phenanthrene, pyrene, chrysene, perylene, butadiene, cumarin, acridine, stilbene, and derivatives thereof.

Besides, the organic layer 4 composed of the laminate structure as above-mentioned can be formed by applying a known method such as vacuum evaporation and spin coating, while using the organic materials synthesized by known methods.

According to the organic EL device 1, 1' configured as above-described, the red light emitting layer 11 having the hole transporting property, the green light emitting layer 12 having the positive and negative charge transporting property, and the blue light emitting layer 13 having the electron transporting property are laminated in this order from the side of the anode 3, whereby emitted light having red, green and blue light emission components can be taken out. Particularly, the arrangement of the red light emitting layer 11 on the most anode 3 side ensures that by configuring the red light emitting layer by use of a hole transporting red light emitting material capable of doping therewith in a high concentration, it is possible to achieve a configuration in which holes can be easily transported into the green light emitting layer 12 and the blue light emitting layer 13 which are disposed on the side of the cathode 5 relative to the red light emitting layer 11. Therefore, respective color light emissions can be obtained with good balance and at high efficiency in the light emitting layers 11, 12 and 13, and the light emission can be conducted stably for a long time.

As a result, by combining the organic EL devices 1 or 1' with color filters, it is possible to provide a display capable of full-color display with excellent color reproduction characteristics for a long time.

Incidentally, in the case of combining the organic EL devices 1 or 1' with color filters to constitute a full-color display, color filters respectively transmitting only the rays in the blue, green and red wavelength regions therethrough are provided on the light take-out surface side of a plurality of the organic EL devices 1 or 1'. As a result, the rays in the blue, green and red wavelength regions are taken out with good balance on the light take-out surface side of each organic EL device 1 or 1' through the color filters for the respective colors, and full-color display with good reproduction characteristics can be achieved.

In the embodiments described above, the configurations of the organic EL devices 1 and 1' in which the anode 3 is provided on the substrate 2, and the organic layer 4 and the cathode 5 are laminated on the anode 3 have been described. However, the present invention is applicable also to an organic device in which a cathode is provided on the substrate 2, and an organic layer and an anode are laminated in this order on the cathode. In that case, it is essential that the light emitting layers constituting the organic layer include a blue light emitting layer, a green light emitting layer, and a red light emitting layer laminated in this order from the lowest layer disposed on the cathode side. In the case of such a configuration, also, the materials and film thicknesses of the cathode and the anode are appropriately selected, whereby both a top emission type configuration and a bottom emission type configuration can be obtained, and the same effects as those of the above-described organic EL devices 1 and 1' can be obtained.

Example 1

In Example 1, the bottom emission type organic EL device 1' described referring to FIG. 2 was manufactured as follows.

First, a cell for an organic EL device was produced in which a film of ITO (about 100 nm thick) as an anode 3 was formed on a substrate 2 composed of a 30 mm×30 mm glass plate, and other region than a central 2 mm×2 mm light emission region of the anode 3 was masked with an insulation film (omitted in the figure) by use of a photosensitive organic insulation material. Next, a metallic mask having an opening was disposed on the upper side of and in proximity to the substrate 2 in the condition where the opening was matched to the exposed portion of the anode 3 (ITO) to be each light emission region, and the following organic layers were sequentially formed by a vacuum evaporation method under a vacuum of $10^{-4}$ Pa or below.

First, as the hole transport layer 10, a film of m-MTDATA (4,4',4"-tris(3-methylphenylphenylamino)-triphenylamine) represented by the following formula (3) was formed in a thickness of 20 nm, and then a film of α-NPD (α-naphthyl-diamine)Bis[N-(1-nephthyl)-N-phenyl]benzidine represented by the following formula (4) was formed in a thickness of 20 nm. The vapor deposition rate was set to 0.1 nm/sec.

Formula (3), Formula (4):

m-MTDATA (3)

α-NPD (4)

Next, as the red light emitting layer 11, a co-deposition film composed of DPVBi of the following formula (5) as a host doped with 30% of BSN of the following formula (6) as a red light emitting material was formed in a thickness of 5 nm. The vapor deposition rate was set to 0.2 nm/sec.

Formula (5), Formula (6):

DPVBi (5)

BSN (6)

Thereafter, as the green light emitting layer 12, a co-deposition film composed of a mixture of DPVBi and α-NPD in a mixing ratio of 1:1 as a host doped with 1% of cumarin 6 of the following formula (7) as a green light emitting material was formed in a thickness of 10 nm. The vapor deposition rate was set to 0.2 nm/sec.

Formula (7):

Coumarin 6

Further, as the blue light emitting layer 13, a co-deposition layer composed of DPVBi as a host doped with 3% of 4,4'-(Bis(9-ethyl-3-carbazovinylene)-1,1'-biphenyl (BCzVBi) of the following formula (8) as a blue light emitting material was formed in a thickness of 30 nm. The vapor deposition rate was set to 0.2 nm/sec.

Formula (8):

BC₂VBi

Then, as the electron transport layer 14, a film of Alq3 represented by the following formula (9) was formed in a thickness of 20 nm. The vapor deposition rate was set to 0.2 nm/sec.

Formula (9):

Alq3

Next, as the cathode 5, a thin film of Mg and Ag with a co-deposition ratio of 10:1 was formed in a thickness of 50 nm, and a film of Ag was formed in a thickness of 150 nm. The vapor deposition rate was set to 0.5 nm/sec.

Figure 3:
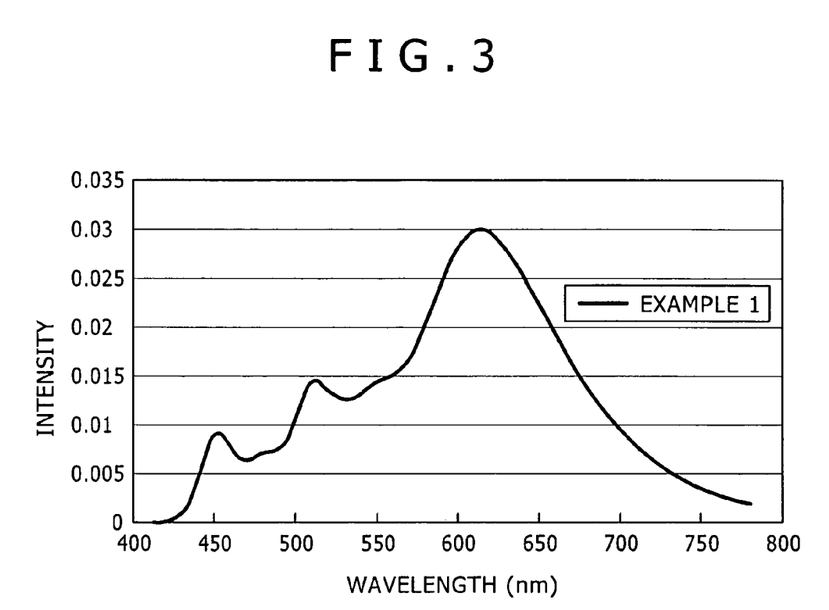
FIG. 3 shows the emission spectrum of an organic EL device produced in Example 1.

The emission spectrum of the organic EL device in Example 1 manufactured as above-described is shown in FIG. 3. As shown in the figure, it was confirmed that blue, green and red light emission components can be obtained from the organic EL device according to Example 1. In addition, light emission with a luminance of 1311 cd/m$^2$ and CIE chromaticity (0.392, 0.390) at a current density of 25 mA/cm$^2$ was obtained evenly over the light emission surface.

Example 2

In Example 2, an organic EL device 1' was manufactured in the same manner as above, except that the blue light emitting layer 13 in Example 1 was replaced by a two-layer structure of a positive and negative charge transporting blue light emitting layer and an electron transporting light emitting layer which will be described below, for obtaining a good balance of white light emission.

In Example 2, the organic EL device 1' was manufactured following the same procedure as that in Example 1, except that the blue light emitting layer 13 was formed by the following procedure. First, a co-deposition film composed of a mixture of DPVBi and α-NPD in a mixing ratio of 1:1 as a host doped with 3% of BCzVBi as a blue light emitting material was formed in a thickness of 10 nm. Thereafter, a co-deposition layer composed of DPVBi as a host doped with 3% of BCzVBi as a blue light emitting material was formed in a thickness of 20 nm, to obtain the blue light emitting layer 13 having a laminate structure.

Figure 4:
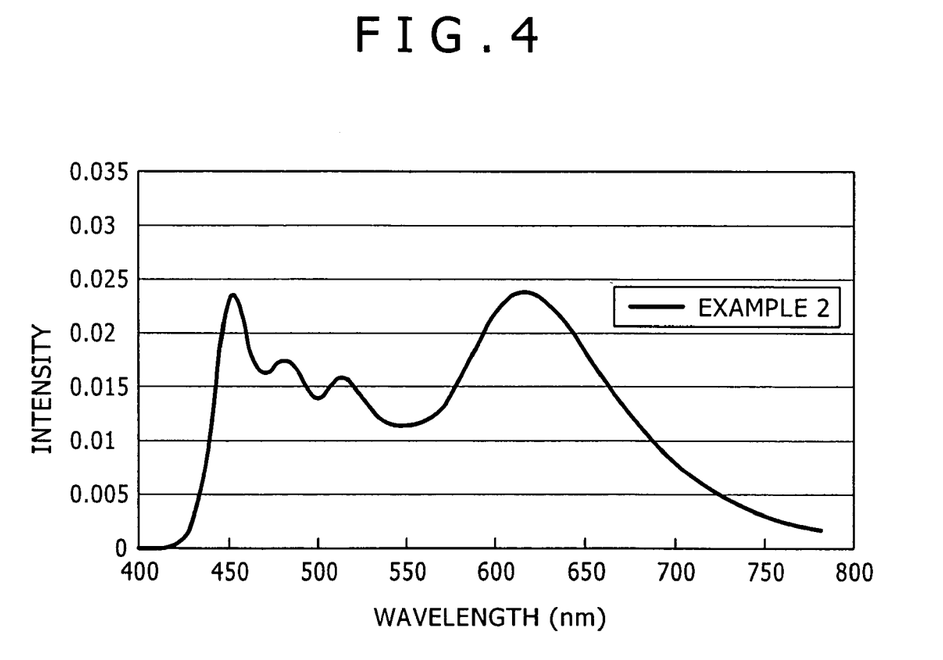
FIG. 4 shows the emission spectrum of an organic EL device produced in Example 2.

The emission spectrum of the organic EL device in Example 2 manufactured as above is shown in FIG. 4. As shown in the figure, it was confirmed that blue, green and red light emission components can be obtained from the organic EL device according to Example 2. In addition, light emission with a luminance of 1126 cd/m$^2$ and CIE chromaticity (0.372, 0.334) at a current density of 25 mA/cm$^2$ was obtained evenly over the light emission surface.

From a comparison of the emission spectrum shown in FIG. 3 with the emission spectrum shown in FIG. 4, it was confirmed that the organic EL device in Example 2 wherein the blue light emitting layer 13 has a two-layer structure showed light emission with a greater blue component and a better balance of white light emission, as compared with the organic EL device wherein the blue light emitting layer 13 has a single-layer structure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. An organic EL device comprising an anode, a cathode, and an organic layer including a plurality of light emitting layers provided between the anode and the cathode, wherein said light emitting layers comprise a red light emitting layer provided on the anode, a green light emitting layer provided directly on the red light emitting layer, and a blue light emitting layer provided directly on the green light emitting layer wherein said blue light emitting layer comprises a positive charge transporting blue light emitting layer and a negative charge transporting blue light emitting layer and an electron transporting light emitting layer laminated in this order from the anode side.

2. The organic EL device as set forth in claim 1, wherein said red light emitting layer is composed of a single layer.

3. The organic EL device as set forth in claim 1, wherein said green light emitting layer is composed of a single layer.

4. The organic EL device as set forth in claim 1, further comprising a protective film covering the organic layer.

5. The organic EL device as set forth in claim 1, wherein said red light emitting layer supplies holes to the green light emitting layer.

6. The organic EL device as set forth in claim 1, wherein said blue light emitting layer supplies electrons to the green light emitting layer.

7. The organic EL device as set forth in claim 1, wherein said red light emitting layer has a hole transporting property, said green light emitting layer has a positive and negative charge transporting property, and said blue light emitting layer has an electron transporting property.

8. A display comprising a color filter provided on a light take out surface side of an organic EL device for emitting white light, wherein said organic EL device comprises an organic layer including a plurality of light emitting layers, said organic layer interposed between an anode and a cathode; and said light emitting layers comprise a red light emitting layer, a green light emitting layer, and a blue light emitting layer laminated in respective order from the anode side wherein said blue light emitting layer comprises a positive charge transporting blue light emitting layer and a negative charge transporting blue light emitting layer and an electron transporting light emitting layer laminated in this order from the anode side.

9. The display as set forth in claim 8, wherein said red light emitting layer has a hole transporting property, said green light emitting layer has a positive and negative charge transporting property, and said blue light emitting layer has an electron transporting property.

10. An organic EL device comprising an anode, a cathode, and an organic layer including a plurality of light emitting layers provided between the anode and the cathode, wherein said light emitting layers comprise a red light emitting layer provided on the anode, a green light emitting layer provided directly on the red light emitting layer, and a blue light emitting layer provided directly on the green light emitting layer, wherein each of said red light emitting layer and green fight emitting layer is composed of a single layer, wherein said blue light emitting layer comprises a positive charge transporting blue light emitting layer and a negative charge transporting blue light emitting layer and an electron transporting light emitting layer laminated in this order from the anode side.

11. An organic EL device as set forth in claim 10, further comprising a protective film covering the organic layer.

12. The organic EL device as set forth in claim 10, wherein said red light emitting layer has a hole transporting property, said green light emitting layer has a positive and negative charge transporting property, and said blue light emitting layer has an electron transporting property.

13. An organic EL device comprising an anode, a cathode, and an organic layer including a plurality of light emitting layers provided between the anode and the cathode, wherein said light emitting layers comprise a red light emitting layer provided on the anode, a green light emitting layer provided directly on the red light emitting layer, and a blue light emitting layer provided directly on the green light emitting layer, wherein said blue light emitting layer comprises a positive charge transporting blue light emitting layer and a negative charge transporting blue light emitting layer and an electron transporting light emitting layer laminated in this order from the anode side.

* * * * *